«12» United States Patent
Stecher et al.

(10) Patent No.: US 10,090,192 B2
(45) Date of Patent: Oct. 2, 2018

(54) METHOD FOR PRODUCING A CONDUCTOR LINE

(71) Applicant: Infineon Technologies Austria AG, Villach (AT)

(72) Inventors: Matthias Stecher, Munich (DE); Markus Menath, Regensburg (DE); Andreas Zankl, Wiesent (DE); Anja Reitmeier, Regensburg (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 52 days.

(21) Appl. No.: 14/936,339

(22) Filed: Nov. 9, 2015

(65) Prior Publication Data

US 2016/0064273 A1 Mar. 3, 2016

Related U.S. Application Data

(62) Division of application No. 13/452,044, filed on Apr. 20, 2012, now Pat. No. 9,214,424.

(51) Int. Cl.
*H01L 21/302* (2006.01)
*H01L 21/461* (2006.01)
(Continued)

(52) U.S. Cl.
CPC ...... *H01L 21/76804* (2013.01); *H01L 21/311* (2013.01); *H01L 21/3115* (2013.01);
(Continued)

(58) Field of Classification Search
CPC ............. H01L 21/76804; H01L 21/743; H01L 21/322; H01L 21/311; H01L 21/31144; H01L 21/3115; H01L 21/44
(Continued)

(56) References Cited

U.S. PATENT DOCUMENTS 6,458,657 B1 * 10/2002 Chang .............. H01L 21/28273
257/E21.209
6,482,701 B1 11/2002 Ishikawa et al.
(Continued)

FOREIGN PATENT DOCUMENTS

CN 1738046 A 2/2006
CN 101390204 A 3/2009
CN 102130510 A 7/2011

OTHER PUBLICATIONS

"Etching Processes," https://www.mems-exchange.org/MEMS/processes/etch.html, Oct. 20, 2014.

*Primary Examiner* — Robert Huber
(74) *Attorney, Agent, or Firm* — Slater Matsil, LLP (57) ABSTRACT

A method for producing a rounded conductor line of a semiconductor component is disclosed. In that method, a partially completed semiconductor component is provided. The partially completed semiconductor component has a bottom side and a top side spaced distant from the bottom side in a vertical direction. Also provided is an etchant. On the top side, a dielectric layer is arranged. The dielectric layer has at least two different regions that show different etch rates when they are etched with the etchant. Subsequently, a trench is formed in the dielectric layer such that the trench intersects each of the different regions. Then, the trench is widened by etching the trench with the etchant at different etch rates. By filling the widened trench with an electrically conductive material, a conductor line is formed.

20 Claims, 12 Drawing Sheets

(51) Int. Cl.
| | |
|---|---|
| *H01L 21/768* | (2006.01) |
| *H01L 21/311* | (2006.01) |
| *H01L 21/322* | (2006.01) |
| *H01L 21/74* | (2006.01) |
| *H01L 21/3115* | (2006.01) |
| *H01L 21/44* | (2006.01) |
| *H01L 23/522* | (2006.01) |
| *H01L 23/528* | (2006.01) |
| *H01L 23/532* | (2006.01) |

(52) U.S. Cl.
CPC ...... *H01L 21/31144* (2013.01); *H01L 21/322* (2013.01); *H01L 21/44* (2013.01); *H01L 21/743* (2013.01); *H01L 21/76802* (2013.01); *H01L 23/5222* (2013.01); *H01L 23/5225* (2013.01); *H01L 23/5227* (2013.01); *H01L 23/5283* (2013.01); *H01L 23/5329* (2013.01); *H01L 23/53223* (2013.01); *H01L 23/53238* (2013.01); *H01L 23/53295* (2013.01); *H01L 2924/0002* (2013.01)

(58) Field of Classification Search
USPC ......... 257/E21.538; 438/270, 381, 700, 701, 438/705
See application file for complete search history.

(56) References Cited

U.S. PATENT DOCUMENTS

| | | |
|---|---|---|
| 6,960,519 B1 | 11/2005 | Dalton et al. |
| 2002/0190301 A1 | 12/2002 | Hsue et al. |
| 2003/0211746 A1* | 11/2003 | Chen ................ H01L 21/76801 438/700 |
| 2006/0038621 A1 | 2/2006 | Shiramizu et al. |
| 2007/0205482 A1 | 9/2007 | Yang et al. |
| 2011/0156854 A1 | 6/2011 | Lee |
| 2011/0176339 A1 | 7/2011 | Kerber et al. |
| 2012/0256290 A1 | 10/2012 | Renna et al. |
| 2013/0277797 A1 | 10/2013 | Menath et al. |

* cited by examiner

000
METHOD FOR PRODUCING A CONDUCTOR LINE

The present application is a divisional application of U.S. patent application Ser. No. 13/452,044 filed on Apr. 20, 2012, which is incorporated herein by reference.

TECHNICAL FIELD

Embodiments of the invention relate to methods for producing a rounded conductor line of a semiconductor component.

BACKGROUND

In many semiconductor components, high voltages are applied between conductor lines of the component during its operation. As such high voltages may cause electrical breakdowns, therefore, there is a need for improvement.

SUMMARY OF THE INVENTION

It was found that the electric field that occurs in the dielectric between the respective conductor lines can be reduced by avoiding sharp outer edges, peaks, etc., at least in certain areas of at least one of the respective conductor lines. Hence, one aspect of the invention relates to a method for producing a rounded conductor line of a semiconductor component. In that method, a partially completed semiconductor component is provided. The partially completed semiconductor component has a bottom side and a top side spaced distant from the bottom side in a vertical direction. Also provided is an etchant. On the top side, a dielectric layer is arranged. The dielectric layer has at least two different regions that show different etch rates when they are etched with the etchant. Subsequently, a trench is formed in the dielectric layer such that the trench intersects each of the different regions. Then, the trench is widened by etching the trench with the etchant at different etch rates. As an etching method, any isotropic wet etching and/or isotropic dry etching method may be used. For instance, a suitable isotropic dry etching technique is chemical dry etching (CDE). In this context, "isotropic" means that the etching rate is isotropic if the etched material is isotropic. That is, in an "isotropic etching method", the method as such is isotropic. However, even if an isotropic etching method is used for etching an anisotropic material, the etching rate normally is anisotropic. By filling the widened trench with an electrically conductive material, a conductor line is formed.

According to further aspects of the invention, the conductor line may be an outer winding of a coil of a coreless transformer of the semiconductor component.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
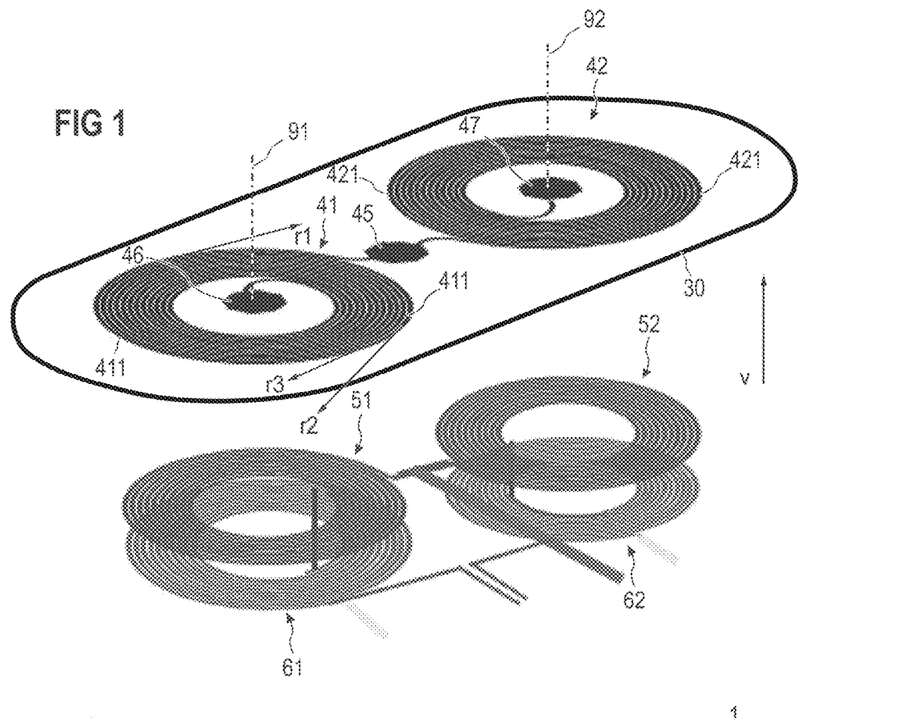
FIG. 1 is a perspective view of coreless transformer coils of a semiconductor device.
Figure 2:
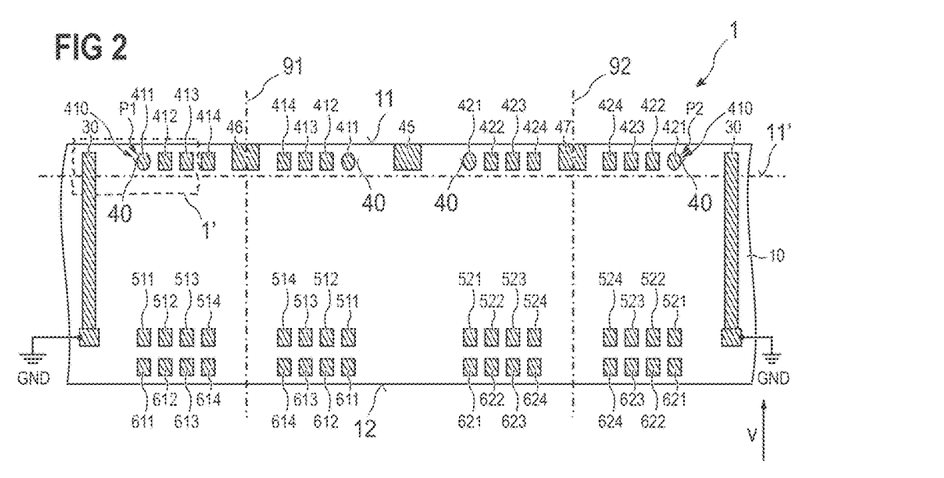
FIG. 2 is a cross-sectional view of the coreless transformer coils of FIG. 1.

Referring now to FIGS. 1 and 2 the coils illustrated are 41, 42, 51, 52, 61, 62 of a coreless transformer of a semiconductor component 1. For the sake of clarity, the other parts of the semiconductor component 1 are omitted. FIG. 2 shows a section of the semiconductor component 1 that includes the coreless transformer which is embedded in a semiconductor body 10 of the semiconductor component 1.

Generally, a coreless transformer requires at least two coils. One coil that operates as a transmitter and another one that operates as a receiver. In the embodiment of FIG. 1 there are two transmitter coils 41, 42 and four receiver coils 51, 52, 61, 62. Each of the coils 41, 42, 51, 52, 61, 62 may have the form of a flat spiral with one or more windings. The coils 41, 51, 61 have a common coil axis 91, the coils 42, 52, 62 a common coil axis 92. A current signal supplied to a transmitter coil 41 or 42 via contact terminals 45, 46, 47, for instance bond pads or solder pads, induces an electric current in the receiver coils 51, 61 and 52, 62, respectively, which are galvanically isolated from the respective transmitter coils 41, 42. In order to suppress stray radiation, a ring-shaped shield ring 30 which may optionally be connected to ground potential (GND) surrounds the transmitter coils 41, 42.

During operation of the semiconductor device, the absolute value of the difference between the electric potentials of a receiver coils 51, 52, 61, 62 and GND does not usually exceed several volts or several ten volts, whereas the difference between the electric potentials of a transmitter coil 41, 42 and GND may exceed several hundred volts, several thousand volts or even several ten thousand volts. Hence, the difference between the electric potentials of a transmitter coil 41, 42 and the shield ring 30 may also exceed several hundred volts, several thousand volts or even several ten thousand volts. In conventional arrangements, most of the electrical breakdowns occur at or close to the top side 11 of the semiconductor component 1 between a transmitter coil 41, 42 and the shield ring 30. Therefore it is advantageous if at least the outermost windings 411 and 421 of the transmitter coils 41 and 42, respectively, have rounded cross-sections at least in their sections located closest to the shield ring 30, that is, in their sections facing away from the respective coil axis 91 and 92, respectively.

FIG. 2 shows a cross-section through the coreless transformer of FIG. 1 in a sectional plane that runs parallel to the vertical direction v and to the coil axes 91 and 92 as well. The vertical direction v runs perpendicular to a top side 11 and to a bottom side 12 of the semiconductor body 10. In this connection, the top side 11 and the bottom side 12 are regarded as substantially planar. Schematically illustrated in FIG. 2 is the border line of the semiconductor component 1. The semiconductor body 10 of the semiconductor component 1 may be formed from an arbitrary semiconductor material like silicon, germanium, silicon carbide, gallium arsenide, etc., and may include p-doped semiconductor regions, n-doped semiconductor regions, dielectric layers like silicon oxide layers, nitride layers or imide layers, and electrically conductive layers and areas made of metal and/or polycrystalline semiconductor material. Optionally, the semiconductor component 1 may comprise one or any combination of active semiconductor devices like IGBTs (insulated gate bipolar transistor), MOSFETs (metal oxide semiconductor field effect transistors), J-FETs (junction field effect transistors), thyristors, diodes. Alternatively or in addition, the semiconductor component 1 may comprise one or any combination of passive devices like resistors, capacitors, inductivities, etc. In particular, such devices can be controllable semiconductor devices that have a control electrode like a gate or a base. At least one of the coils 41, 42, 51, 52, 61, 62 may be directly (i.e., only via an electrically conductive line) or indirectly (i.e., via active and/or passive elements, for instance a driver circuit for driving the controllable semiconductor device) electrically connected to such a control electrode.

As can be seen from FIG. 2, the coil 41 has spiral-shaped windings 411, 412, 413 and 414. Accordingly, the coil 42 has spiral-shaped windings 421, 422, 423 and 424, the coil 51 has spiral-shaped windings 511, 512, 513 and 514, the coil 52 has spiral-shaped windings 521, 522, 523 and 524, the coil 61 has spiral-shaped windings 611, 612, 613 and 614, and the coil 62 has spiral-shaped windings 621, 622, 623 and 624. The upper coils 41, 42, that is, the coils that are arranged close to the top side 11, are surrounded by a shield ring 30 which may optionally be connected to GND potential. Also optionally, the shield ring 30 may extend in the negative vertical direction v as far as approximately the level of the bottom coils 51, 52, 61, 62. In order to achieve a shielding effect, the shield ring 30 may be electrically connected to ground potential GND.

As is also schematically illustrated in FIG. 2, the outer winding 411, 421 of at least one of the transmitting coils 41, 42 has a rounded cross-section, that is, in at least one cross-sectional plane parallel to the respective coil axis 91 and 92, respectively, and perpendicular to the running direction of the respective winding 411, 421, the surfaces 40 of that outer windings 411, 421 are a least partly rounded. For instance, in the cross-sectional plane the respective surface 40 may have in at least one point P1, P2, a radius of curvature of at least 0.4 µm, and/or of less than or equal to 3.2 µm, e.g., about 1.6 µm.

Next, a method for producing such a device in cross-section at least partly rounded conductor line will be explained with reference to FIGS. 3A to 3H by taking the example of the outer winding 411 of the transmitting coil 41 of FIGS. 1 and 2. The starting point is a partially completed semiconductor body 10 with a bottom side 12 and with a top side 11' which is spaced distant from the bottom side 12 in the vertical direction v. In FIG. 2, the plane of the former top side 11' which runs perpendicular to the vertical direction v is indicated by a dashed line.

Figure 3A:
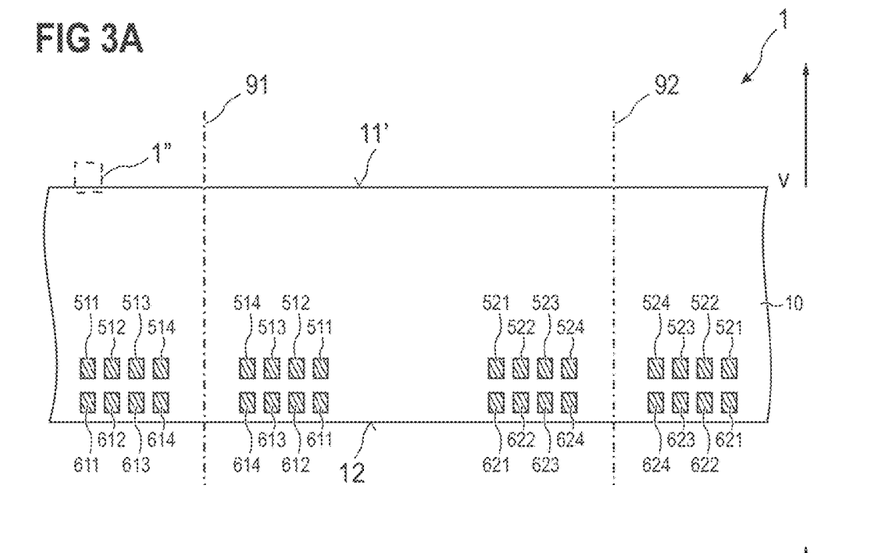
FIGS. 3A to 3H illustrate different steps for producing a rounded conductor line of a semiconductor chip.
Figure 3B:
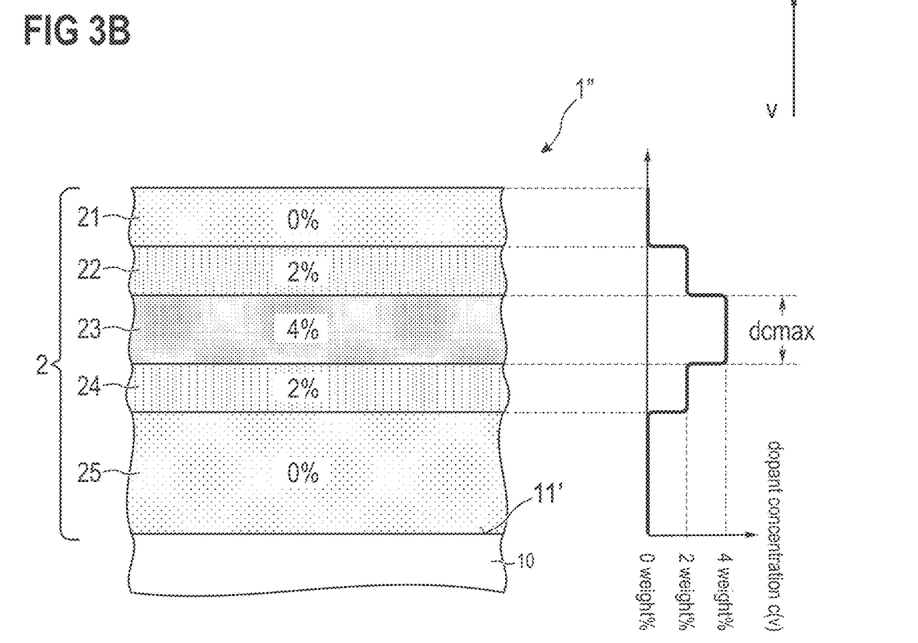

As illustrated in FIG. 3B which is an enlarged section 1" of the component 1 indicated in FIG. 3A by a dashed line, a dielectric layer 2 is arranged on the top side 11'. In the illustrated example, reference numeral 11' relates to a top side of the semiconductor body 10. Generally, reference numeral 11' is the top side of a partly completed semiconductor component 1, that is, the top side may also be formed or include dielectric material, conductive material, doped semiconductor material, undoped semiconductor material, metal, polycrystalline semiconductor material, either alone or in any combination.

The dielectric layer 2 has different sub-layers 21, 22, 23, 24, 25, wherein directly adjacent layers show different etch rates when being etched with the same etchant. To this, directly adjacent ones of the sub-layers 21, 22, 23, 24, 25 may be made of different material compositions that show different etch rates for a selected etchant with which the dielectric layer 2 will be etched later in order to widen a trench in the dielectric layer 2. In this context, two adjacent sub-layers are also regarded as being made of different material compositions if they are formed from the same base material but differently doped. In this sense, differently doped includes "doped with the same dopant but with different dopant concentrations" and/or "doped with different dopants." Also included are combinations in which one of the directly adjacent sub-layers consists of a base material and therefore is undoped, and the other one of the directly adjacent sub-layers has the same base material but is doped with a dopant. In any case, the material of the dielectric layer 2 shows, in the vertical direction v, a non-constant etch rate for the selected etchant. In the present embodiment, each of the sub-layers 21, 22, 23, 24, 25 has, in the vertical direction v, a thickness of at least 100 nm or of at least 400 nm, and/or of less than or equal to 2 µm. For instance, a possible range for that thickness is from 100 µm to 2 µm. However, any other thickness may also be used.

In the embodiment illustrated in FIG. 3B, the dielectric layer 2 is made of a base material, for instance a silicon oxide, which is doped with a dopant, for instance phosphorus (P), boron (B), silver (Ag), arsenic (As), argon (Ar), or a combination thereof, that affects the wet and/or dry etching rate of the dielectric layer 2. In the vertical direction v, the dopant of the dielectric layer 2 has a nonconstant course of concentration. Hence, if the dielectric layer 2 is subsequently wet and/or dry etched, even if the etching method as such is isotropic, different etch rates can be achieved during the same etch process as sections of the dielectric layer 2 have different dopant concentrations.

The production of the dielectric layer 2 may take place by first depositing sub-layer 25 on the top side 11', then by depositing sub-layer 24 on sub-layer 25, then by depositing sub-layer 23 on sub-layer 24, then by depositing sub-layer 22 on sub-layer 23, and finally by depositing sub-layer 21 on sub-layer 22. As illustrated on the right side of FIG. 3B, the sub-layers 21 and 25 have a dopant concentration of 0 weight % and the sub-layers 22 and 24 a dopant concentration of 2 weight %. Sub-layer 23 has a dopant concentration of 4 weight %. which is the maximum dopant concentration. In this regard, 1 weight % means that 1 kg doped silicon oxide ($SiO_2$) includes 40 g of the dopant. In other embodiments, the maximum dopant concentration may be, for instance more than 4 weight %, e.g., at least 8 weight %.

In the vertical direction v, the maximum dopant concentration may extend over a thickness dcmax which may be, for instance at least 100 nm. Further, maximum dopant concentration may be spaced distant from both the former top side 11' and from that side of the dielectric layer 2 facing away from the bottom side (see FIG. 2).

If the same base material, for instance a silicon oxide, is used for all sub-layers 21, 22, 23, 24, 25 of the dielectric layer 2, the base material for all sub-layers 21, 22, 23, 24, 25 may be continuously deposited on the top side 11' using a vapor deposition process in which the dielectric layer 2 is deposited from a gaseous phase in which the concentration of the dopants is varied during the deposition process such that the resulting dielectric layer 2 shows a sub-layer structure as described. Different from the instant embodiment, the number of adjacent sub-layers that exhibit different etch rates may be less or more than 5. Generally, the dielectric layer 2 has at least two sub-layers. However, with an increasing number of such sub-layers the 21, 22, 23, 24, 25 the roundness of the conductor line to be produced can be improved.

Figure 3C:
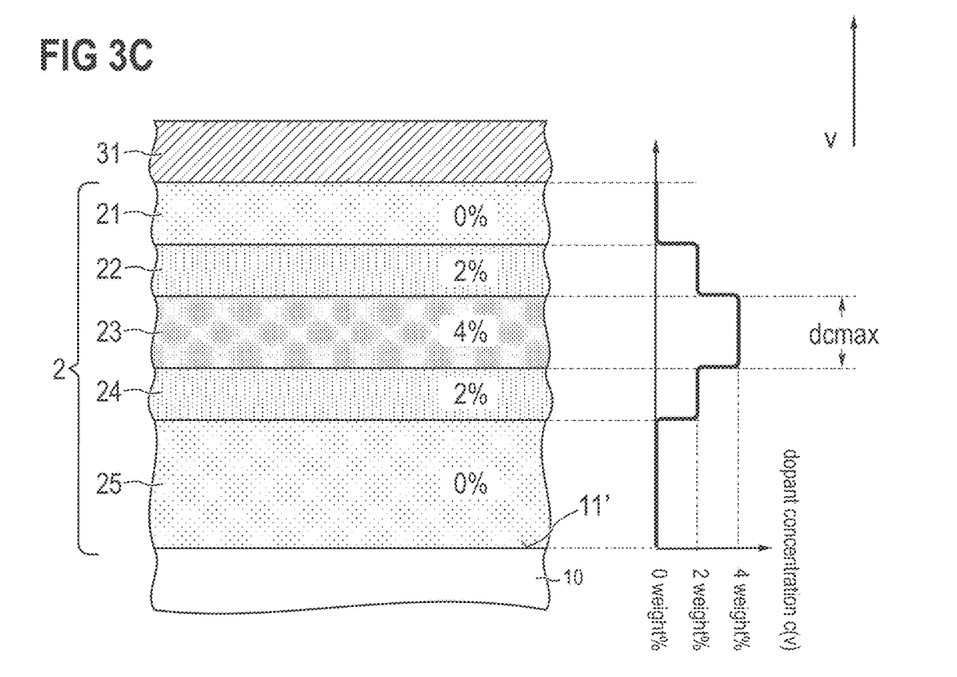
Figure 3D:
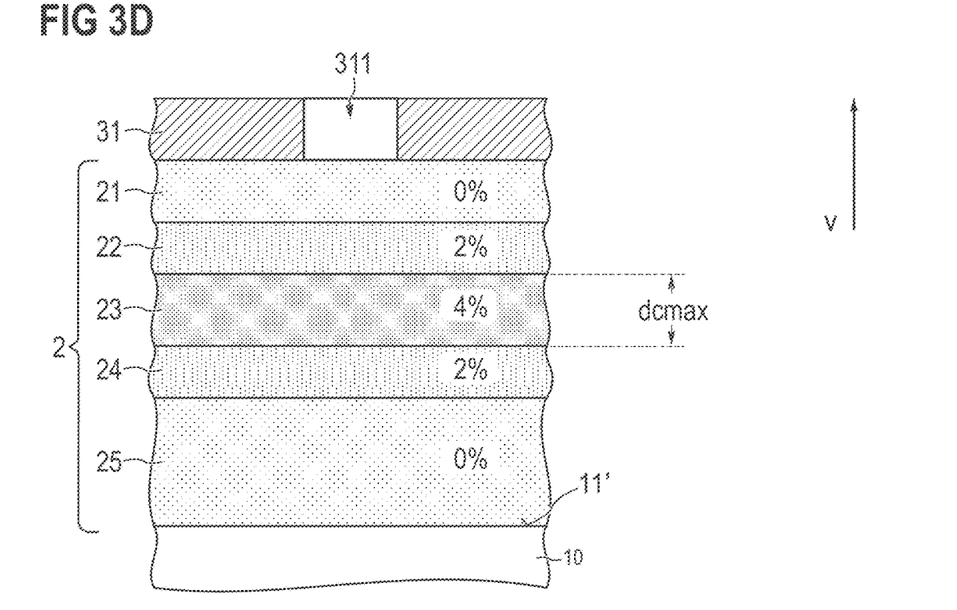
Figure 3E:
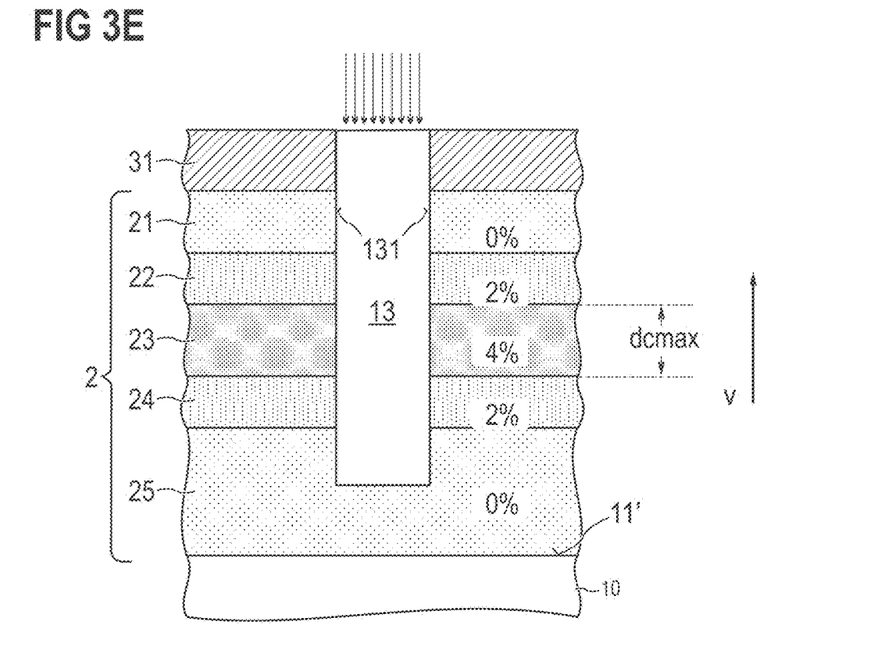

Referring now to FIGS. 3C to 3E, an etching mask layer 31, for instance a silicon nitride layer or another suitable layer, is arranged on the dielectric layer 2 (FIG. 3C) and then, for instance photolithographically, structured so as to have an opening 311 in which the dielectric layer 2 is exposed (FIG. 3D). Then, as illustrated in FIG. 3E, a trench 13 is etched underneath the opening 311 using the structured etching mask layer 31. For instance, the trench 13 may have, in the vertical direction v, a depth of at least 0.5 µm or of at least 3 µm. However, the minimum depth of the trench 13 may be below or above that value.

The respective etching process may be a dry etch process like, for instance, an anisotropical plasma etch process like reactive ion etching (RIE), deep reactive ion etching (DRIE), or high-density plasma etching (HDP). In FIG. 3E, the bottom of the trench 13 is spaced distant from the top side 11'. However, the trench 13 may also pierce through the top side 11' into the semiconductor body 10. If the conductor line to be produced is a spiral-shaped coil like, for instance, a coil of a coreless transformer as described above, the running direction of the trench 13 may be spiral-shaped as well. However, the trench 13 and the conductive line to be produced in the trench 13 may follow any other run as well.

In a subsequent wet and/or isotropic dry etching process, the selected etchant is introduced into the trench 13 such that the trench 13 is filled with the liquid or gaseous etchant and the etchant contacts the surface 131 (FIG. 3E) of the trench 13. Suitable wet etchants are, for instance, hydrofluoric acid (HF), or a mixture of ammonium fluoride ($NH_4F$) and hydrofluoric acid (HF), e.g., at a ratio of 30 Vol %÷6 Vol %.

Figure 3F:
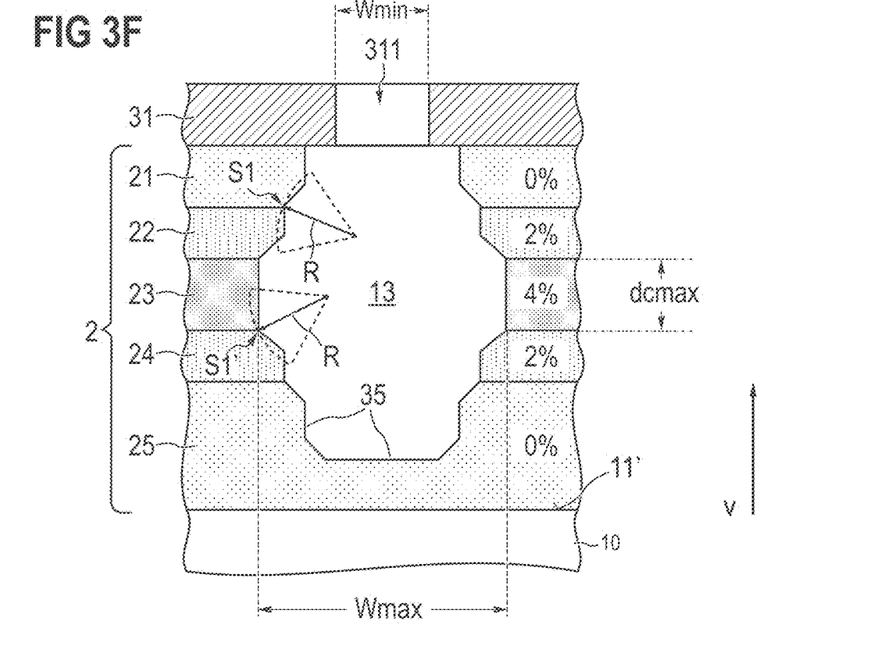

During the etching process, adjacent ones of the different sub-layers 21, 22, 23, 24, 25 are, due to their different material compositions (here: different doping concentrations) etched at different etch rates. Regardless whether different etch rates of adjacent sub-layers 21, 22, 23, 24, 25 are achieved by different dopant concentrations of the different sub-layers 21, 22, 23, 24, 25 or by any other measure described above, the trench 13 shown in FIG. 3E is widened during the wet and/or dry etch process. The widened trench 13 is depicted in FIG. 3F. As illustrated, the wet and/or etch process may take place with the structured mask layer 31 arranged on the top side 11', or, alternatively, with the mask layer 31 partially or completely removed (not shown). As illustrated in FIG. 3F, the surface of the widened trench 13 may have, in a cross-sectional plane perpendicular to the running direction of the trench 13, one or more locations S1, S1' at which the radius of curvature R of the surface of the trench 13 is at least 0.4 µm and/or less than or equal to 3.2 µm. For instance, in some embodiments R may be about 1.6 µm. After the trench 13 is completed, a barrier layer 35 (FIG. 3F) may optionally be deposited on the surface of the widened trench 13 so as to cover the whole surface of the trench 13. Such a barrier layer 35 avoids a diffusion of the conductor material, that will be filled into the trench 13 in a subsequent step, into the semiconductor body 10. For instance, copper may adversely affect an electronic semiconductor element that is realized in the semiconductor body 10. Hence, if the conductor material includes copper and if the semiconductor body includes a semiconductor element, providing a barrier layer 35 is highly recommended. For example, suitable barrier materials against the diffusion of copper and any other electrically conductive material are tantalum (Ta), titanium (Ti), tungsten (W), tantalum nitride (TaN), titanium nitride (TiN), tungsten nitride (WN), titanium-tungsten (TiW), titanium-tungsten nitride TiWN, silicon nitride (SiN), or combinations thereof. For instance, a suitable combination is a double layer that has a tantalum (Ta) layer and a tantalum nitride (TaN) layer, or a double layer that has titanium (Ti) layer and a titanium nitride (TiN) layer.

As illustrated in FIG. 3F, in a cross-sectional plane (the drawing plane) perpendicular to the running direction (perpendicular to the drawing plane), the opening 311 has a minimum width $W_{min}$ and the widened trench 13 has, in a region between the opening 311 and the bottom side 12 (FIG. 2), a maximum width $W_{max}$ that is greater than the minimum width $W_{min}$. In other words, the unit formed by the trench 13 and the opening 311 has a back taper. Thereby, the maximum width $W_{max}$ may be greater than the difference between both (a) the distance between the bottom side 12 (FIG. 2) and the opening 311 and (b) the distance between the bottom side 12 and the conductor line 411.

Figure 3G:
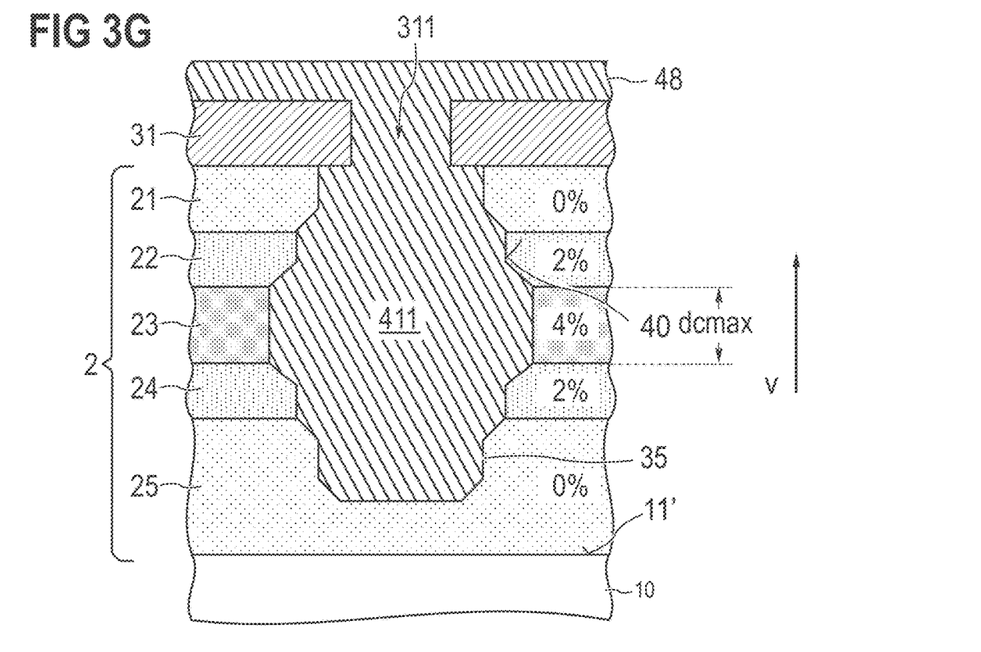

Referring now to FIG. 3G, a conductor line 411 is formed in the widened trench 13. To this, the widened trench 13 is filled with electrically conductive material, for instance copper, aluminum, graphite, graphene or a mixture or combination that comprises any two or more of the mentioned materials and allotropes, respectively. If the conductor line 411 is not required to carry large currents, also doped or undoped polycrystalline semiconductor material may be used as electrically conductive material.

Filling the widened trench 13 may take place with the structured mask layer 31 overlaying the dielectric 2 or with the structured mask layer 31 partially or completely removed. If the opening 311 still exists, the electrically conductive material may be introduced into the widened trench 13 through the opening 311. As shown in FIG. 3G, the widened trench 13 may be overfilled such that the electrically conductive material forms a conductive layer 48 that overlies the dielectric layer 2, and, optionally, the structured mask layer 31 or the remainder thereof, if the structured mask layer 31 was not or not completely removed prior to the filling process.

Figure 3H:
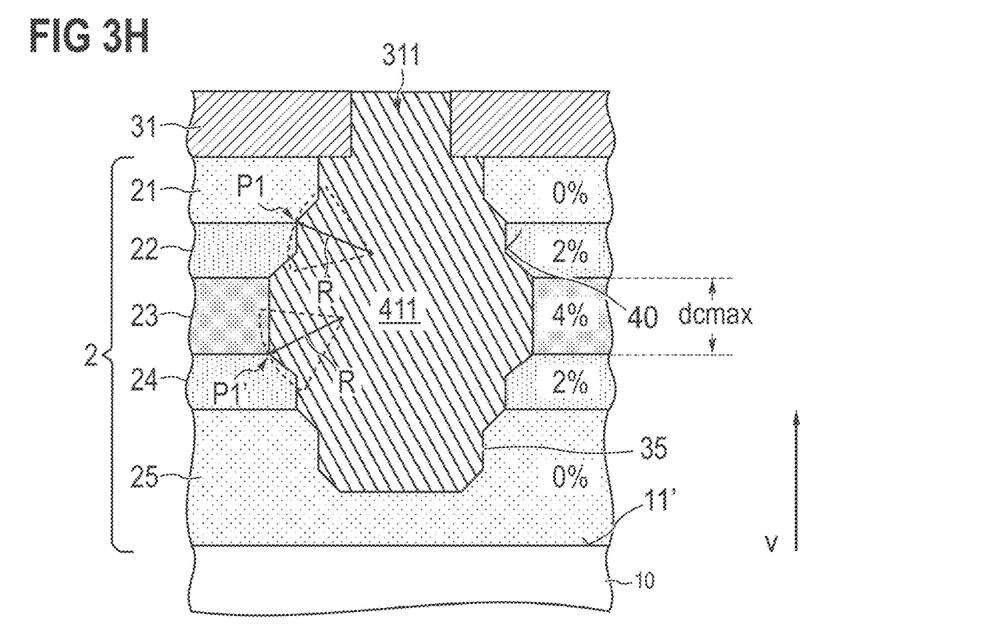

Referring now to FIG. 3H, in an optional step subsequent to the filling process, the arrangement may be flattened on its side facing away from the bottom side 12 (FIG. 3A), for instance by grinding, polishing, lapping, etc. Thereby, the conductive layer 48, where it exists, may be partially or completely removed.

The completed conductor line 411 has an at least partly rounded surface 40. At at least one point P1, P1' on the surface 40, the surface 40 has, in a sectional plane (here: the drawing plane) that extends perpendicular to the running direction of the conductor line 411 (the running direction runs perpendicular to the drawing plane), the surface 40 has a radius of curvature R which may be in the same range as the radius of curvature R mentioned above with reference to FIG. 3F as the thickness of an optional barrier layer 35 may be neglected.

Figure 4A:
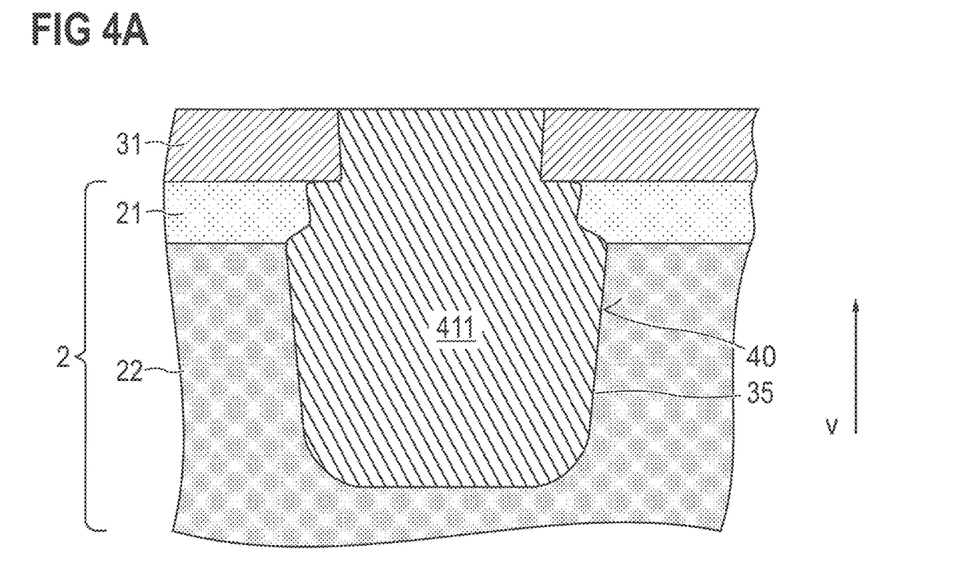
FIG. 4A illustrates a further example of a rounded conductor line of a semiconductor chip.

According to a further embodiment illustrated in FIG. 4A, the dielectric layer 2 includes two sub-layers 21 and 22. Sub-layer 21 is made of an undoped base material, for instance a silicon oxide, and sub-layer 22 is made of the same base material but additionally doped with a dopant, for instance phosphorus (P), boron (B), silver (Ag), arsenic (As), argon (Ar), or a combination with at least two of these dopants. Alternatively, both the first sub-layer 21 and the second sub-layer 22 may be made of a base material that is doped with a dopant, for instance phosphor (P), boron (B), silver (Ag), arsenic (As), argon (Ar), or a combination with at least two of these dopants, wherein the doping of the first and second sub-layer 21, 22 is such that when being etched with the same etchant that later will be used for widening the trench, the etch rate of the second sub-layer 22 exceeds the etch rate of the first sub-layer 21. Due to the different etch rates, the etch rate of sub-layer 22 is greater than the etch rate of sub-layer 21. The widened trench in which the conductor line 411 is arranged has been produced by firstly dry etching a trench into the dielectric layer 2 as explained above with reference to FIGS. 3D and 3E, by subsequently widening that trench by wet and/or dry etching and by coating the surface of the trench with an optional barrier layer 35 as explained above with reference to FIG. 3F, and by filling the trench with an electrically conductive material as explained above with reference to FIGS. 3G and 3H.

Figure 4B:
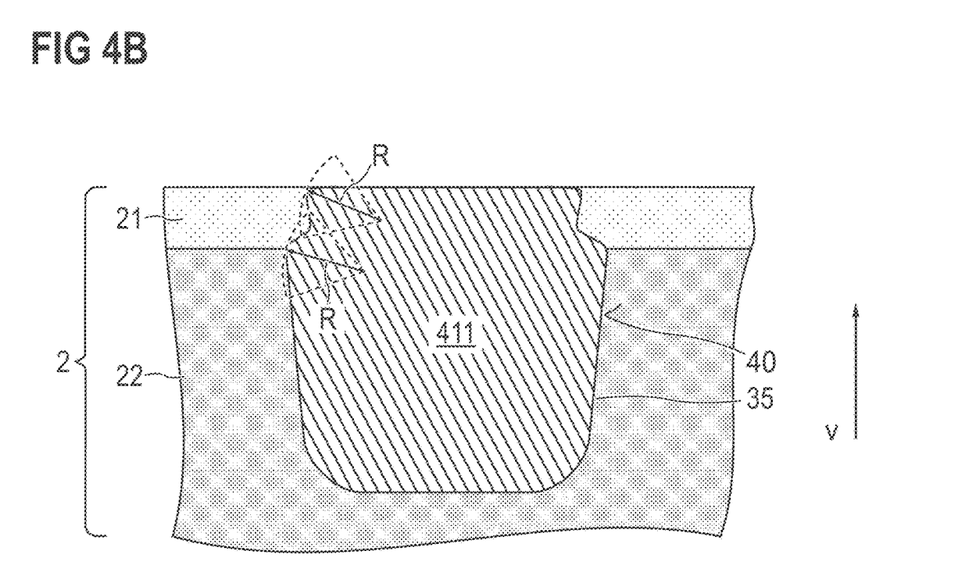
FIG. 4B illustrates the arrangement of FIG. 4A after a mask layer has been removed.

According to a further option illustrated in FIG. 4B, the mask layer 31 that has been used for the dry etching process may partially or completely removed.

Figure 5:
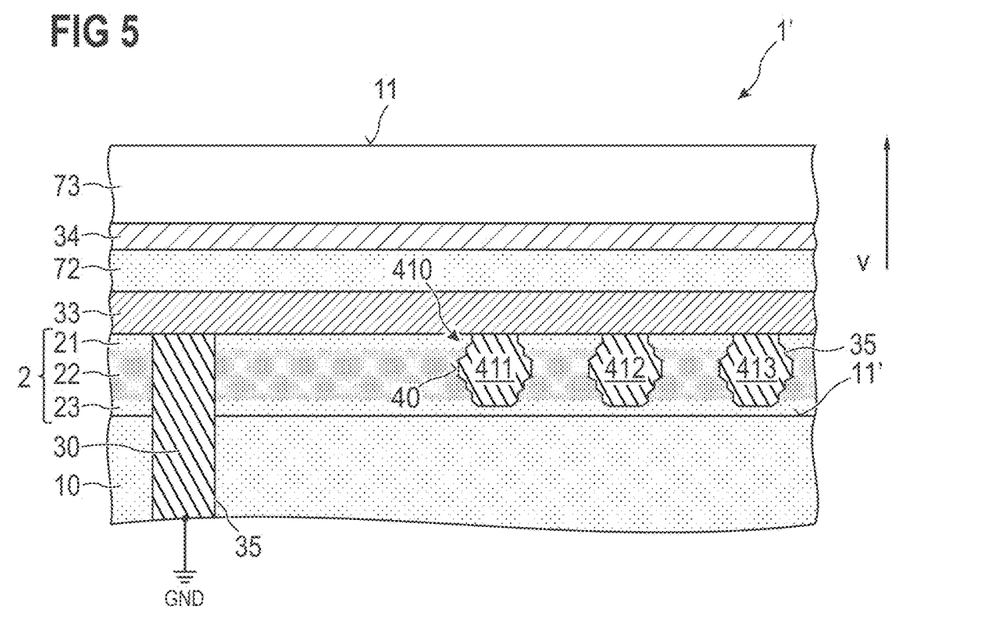
FIG. 5 is a cross-sectional view through a coreless transformer section of a semiconductor chip, wherein the windings of a transformer coil are rounded.

FIG. 5 shows a section 1' of a semiconductor component 1. That section 1' corresponds to a section 1' illustrated in FIG. 2. Prior to the production of the windings 411, 412, 413 of a coil of a coreless transformer, the partially completed semiconductor component had a top side 11'. On that former top side 11', the winding 411 of the coil was produced in the same manner as the conductor line 411 of FIG. 4B. Optionally, as also illustrated in FIG. 5, some or all of the other windings 412, 413 of the coil may be produced in the same manner as the outermost winding 411 so as to exhibit an at least partially rounded surface.

The coil 41 (see also FIGS. 1 and 2) is surrounded by an electrically conductive shield ring 30 which is arranged in a trench. Such a shield ring 30 may be produced with a damascene process, for instance by producing a trench with anisotropic dry etching process, and by subsequently filling that trench with an electrically conductive material which may also be, for instance, copper, aluminum, graphite, graphene or a mixture or combination that comprises any two or more of the mentioned materials and allotropes, respectively. If the shield ring is not required to carry large currents, also doped or undoped polycrystalline semiconductor material may be used as electrically conductive material. Preferably, the shield ring 30 is made of the same electrically conductive material as is used for the windings 411, 412, 413. However, different electrically conductive materials may be used as well. Optionally, the surface of the trench may be coated with a barrier layer 35 in the same way and using the same materials as explained above with reference to FIG. 3F.

After the production of the coil 41 that includes the windings 411, 412, 413, the device may be processed further in an arbitrary manner. In the example of FIG. 5, a silicon nitride layer 33, a silicon oxide layer 72, a hydrogen comprising silicon nitride layer 34 and an imide layer 73 are subsequently deposited over the dielectric layer 2, the windings 411, 412, 413, and the shield ring 30.

Figure 6:
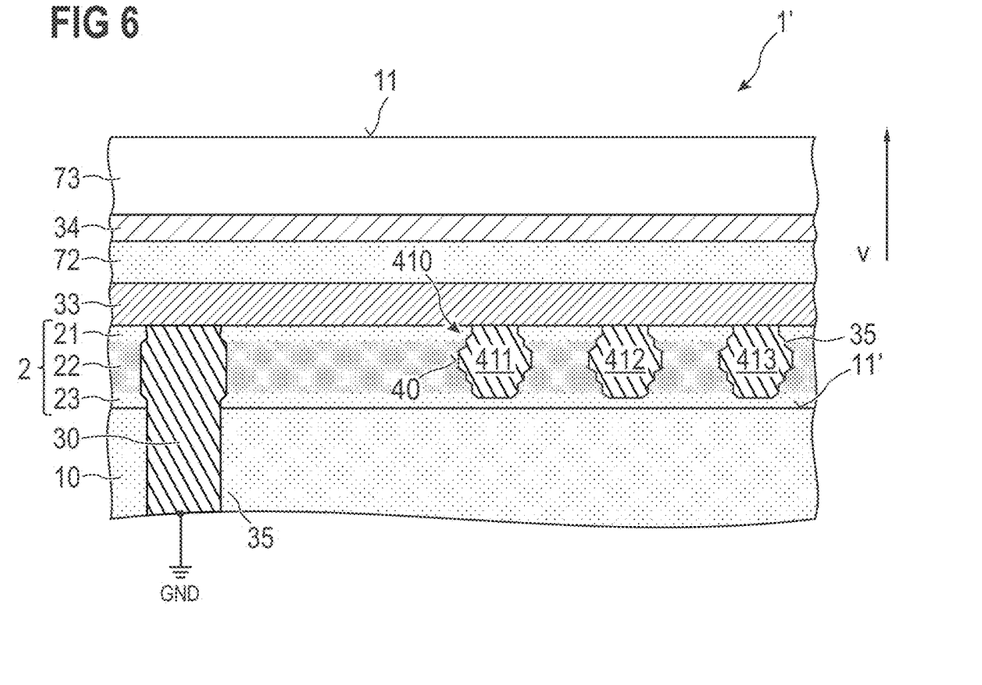
FIG. 6 is a cross-sectional view through a coreless transformer section of a semiconductor chip which differs from the coreless transformer section of FIG. 5 in that the shield ring is also rounded in cross-section.

Alternatively, as illustrated in FIG. 6, an in cross-section at least partly rounded shield ring 30 may be produced using the same principle, steps and materials as the at least partly rounded outer winding 411, see in particular FIGS. 3A to 3H, 4A and 4B, that is, by etching a trench, widening the trench, optionally coating the trench with a barrier layer, and by filling the trench with an electrically conductive material. In the arrangement of FIG. 6, the trench containing the conductor line 411.

In the embodiments described above with reference to FIGS. 3B to 3H, 4A and 4B, an at least partly rounded conductor line 411 has been produced starting from a dielectric layer 2 that has two or more sub-layers 21, 22, 23, 24, 25, wherein any two adjacent sub-layers 21, 22, 23, 24, 25 show different etching rates when they are exposed to the selected etchant.

Figure 7A:
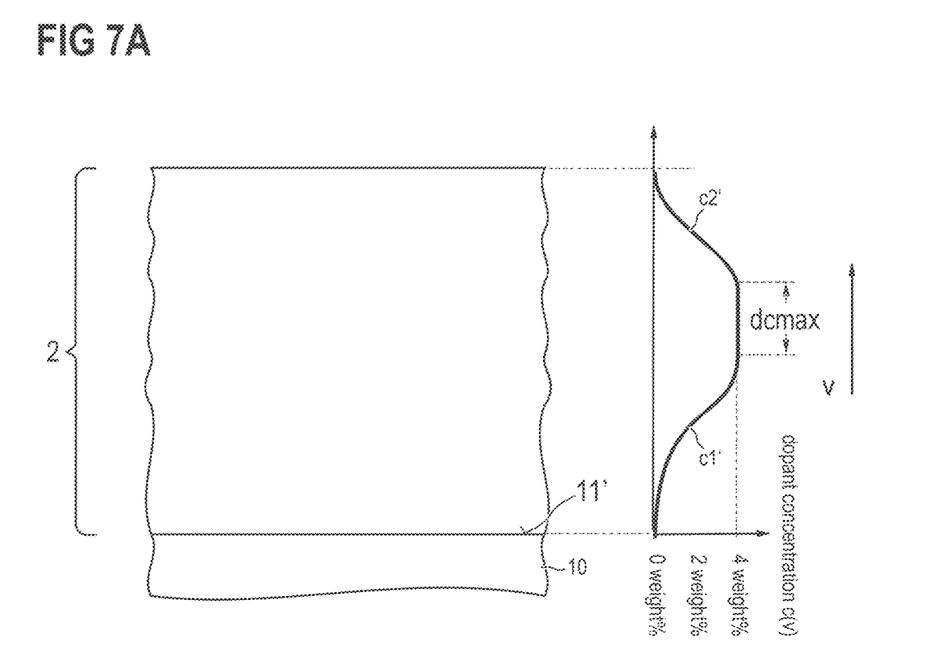
FIGS. 7A to 7F illustrate different steps of a further method for producing a rounded conductor line of a semiconductor chip.
Figure 7B:
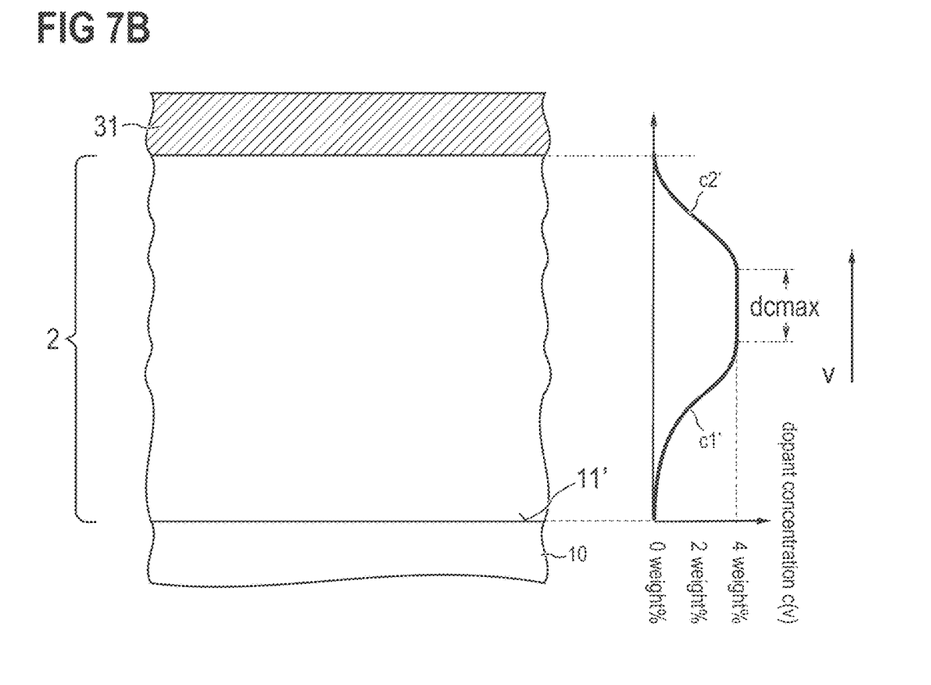
Figure 7C:
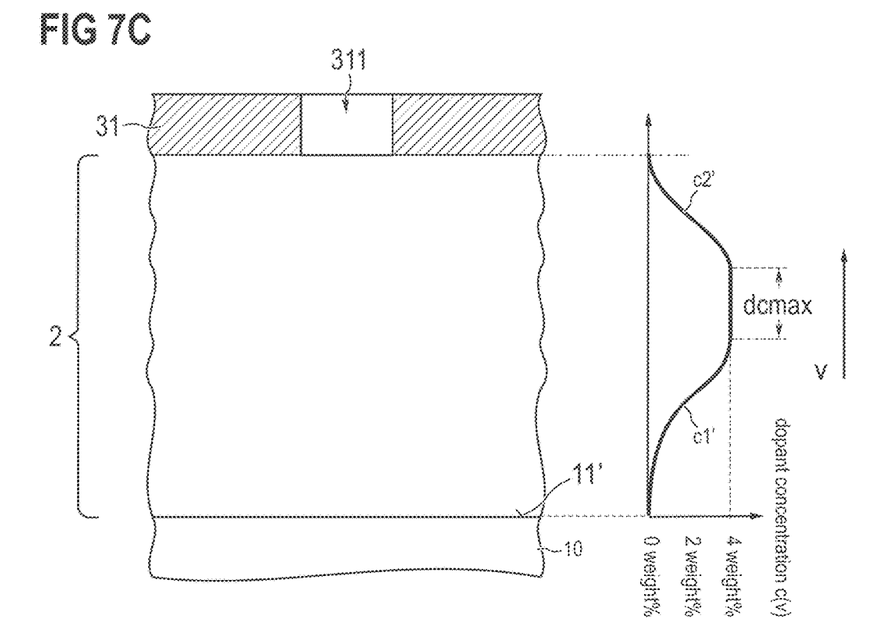
Figure 7D:
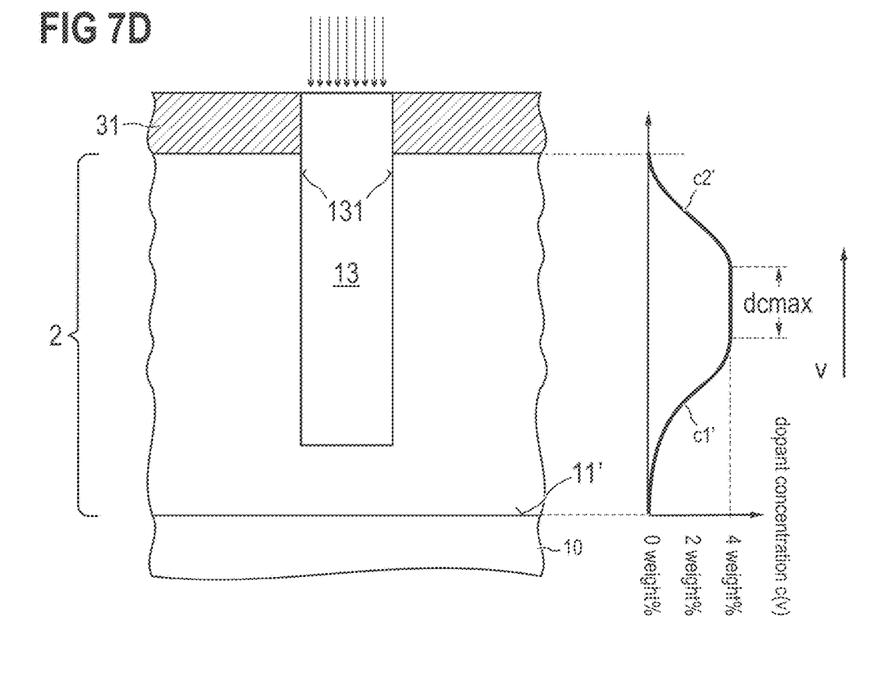
Figure 7E:
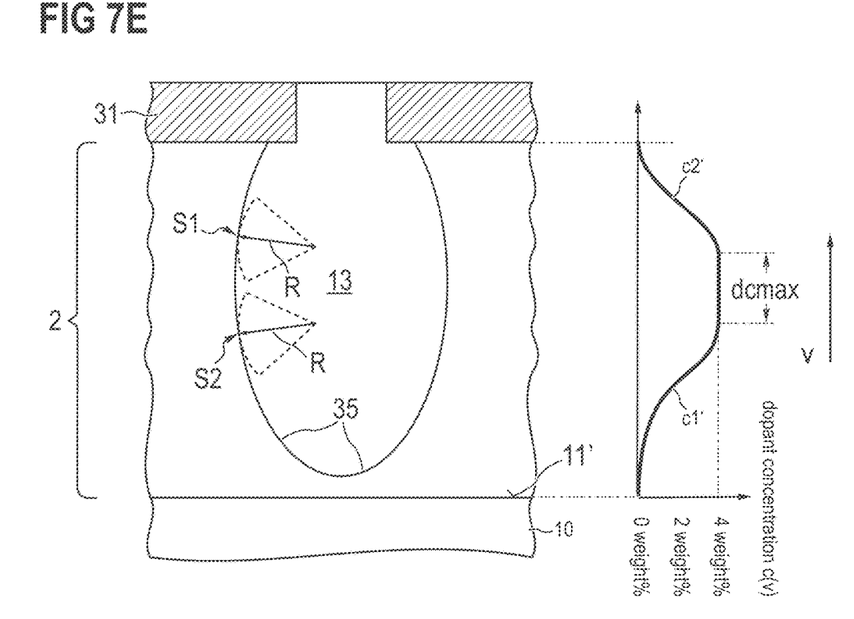

A further embodiment will now be explained with reference to FIGS. 7A to 7F. Starting from an arrangement as explained with reference to FIG. 3A, a dielectric layer 2 depicted in FIG. 7A is produced on the top side 11'. The dielectric layer 2 is formed from a base material, for instance a silicon oxide, that is doped with a dopant, for instance phosphorus (P), boron (B), silver (Ag), arsenic (As), argon (Ar), or a combination thereof, different from the embodiments described above with reference to FIGS. 3B to 3H, 4A and 4B, the doping profile of the dielectric layer 2 does not have a stepped structure but a profile that continuously and smoothly varies in the vertical direction v. That is, within the dielectric layer 2, the dopant concentration c of the dielectric layer 2 is a differentiable function of the vertical direction v. In the vertical direction v, the dopant concentration first has an increasing branch in which a gradient $c1'=dc(v)/dv$ is greater than zero and reaches a value of at least 1 weight % per µm, or of at least 2 weight % per µm. After passing the maximum dopant concentration, the dopant concentration has a decreasing branch in which a gradient $c2'=dc(v)/dv$ is smaller than zero and reaches a value of less than or equal to −1 weight % per µm, or even of less than or equal to −2 weight % per µm.

Subsequently, the same steps are carried out as described above with reference to FIGS. 3C to 3H. The sole difference between the embodiment of FIGS. 3C, 3D, 3E, 3F and 3H and the embodiment of the corresponding FIGS. 7B, 7C, 7D, 7E and 7F, respectively, is the different structure of the respective dielectric layers 2. Due to the differentiable course of the dopant concentration c of the dielectric layer 2, the surface of the trench 13 (FIG. 7E) and the surface 40 of the conductive line 411 is more smoothly than the respective surfaces shown in FIGS. 3F and 3G, respectively.

In order to produce a dielectric layer 2 in which the dopant concentration c of the dielectric layer 2 is a differentiable function of the vertical direction v, the dielectric layer 2 may be deposited on the surface 11' from the gaseous phase that includes the dopant(s) and in which the dopant concentration is appropriately amended during the deposition process so as to achieve the desired dopant profile.

Figure 7F:
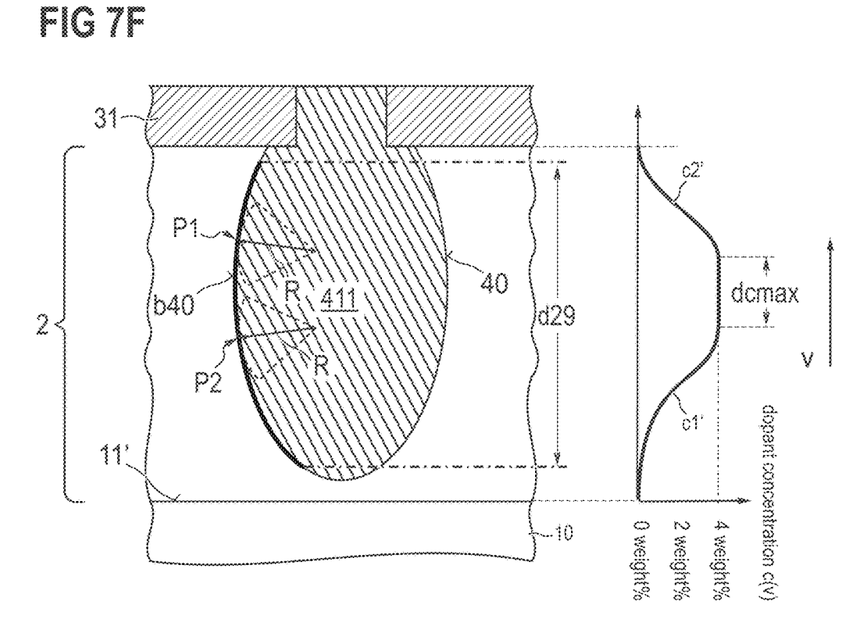

As can also be seen from FIG. 7F, in a cross-sectional plane (the drawing plane) perpendicular to the running direction of the trench 13 (see FIG. 7E), for any point P1, P2 of a continuous surface path b40 (indicated by a bold line) along the surface 40 of a conductive line 411, the radius R of curvature of the conductive line 411 may be at least 0.4 µm. Optionally, for any point P1, P2 of the continuous surface path, the radius R of curvature of the conductive line 411 may be less than or equal to 3.2 µm. For instance, for any point P1, P2 of the continuous surface path, the radius R of curvature of the conductive line 411 may be in the range from 0.4 µm to 3.2 µm. In the vertical direction v, the continuous surface path may extend over a distance d29 of at least 100 nm, or even of at least 0.8 µm.

Figure 8A:
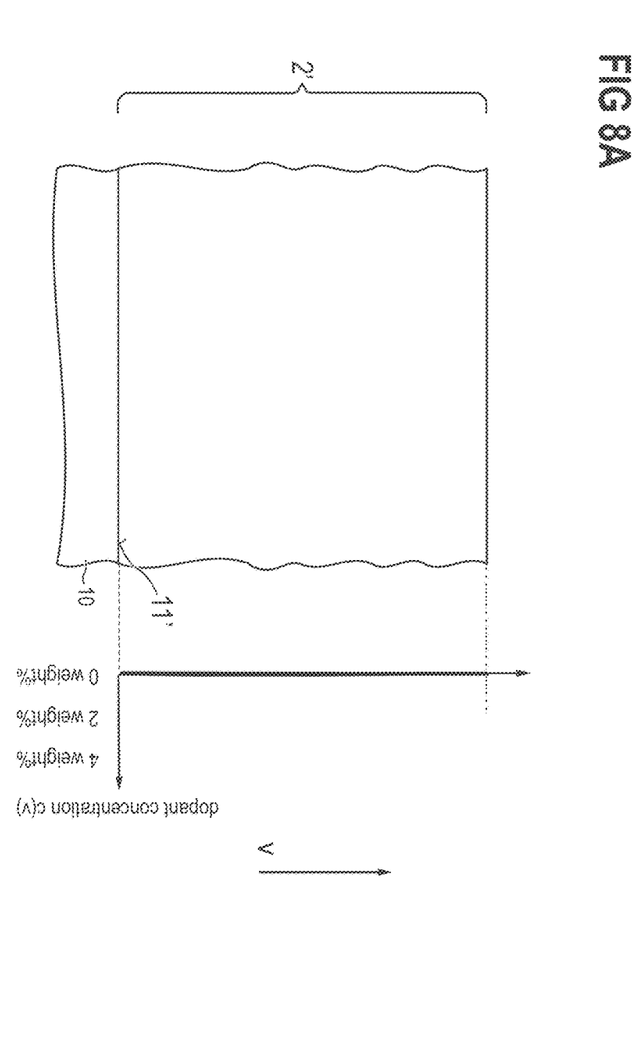
FIGS. 8A and 8B illustrate different steps of a method for producing a varyingly doped dielectric layer.
Figure 8B:
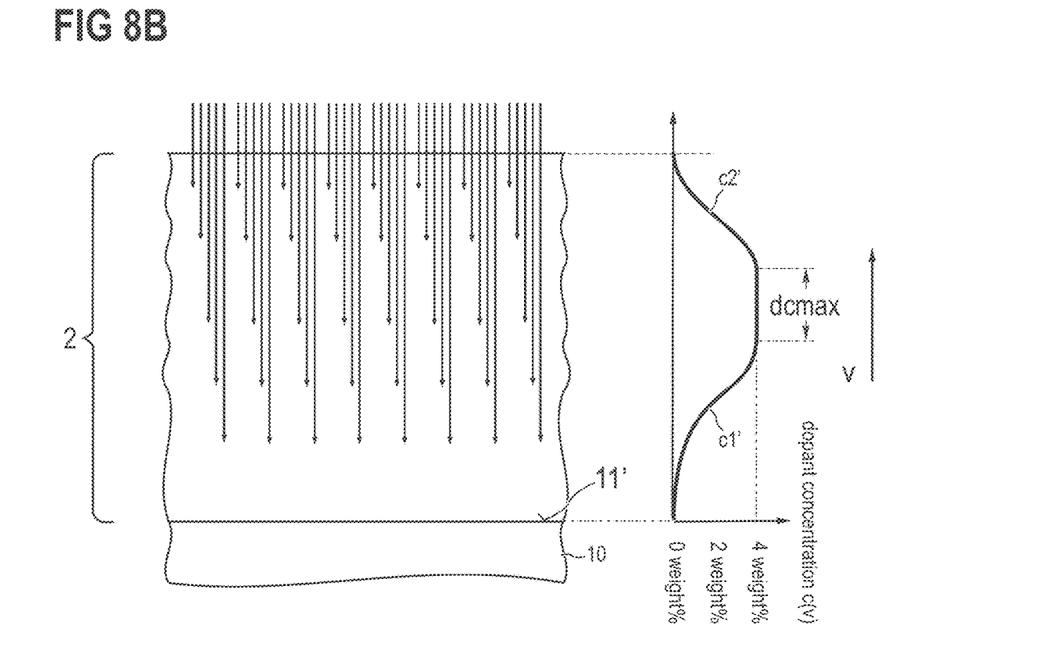

A further alternative is to produce an undoped or a homogeneously doped dielectric layer 2' on the surface 11' as illustrated in FIG. 8A. Then, one or more dopants may be implanted into the dielectric layer 2' as illustrated in FIG. 8B. As the implantation depth depends on the energy of the implanted dopants, the desired doping profile can be adjusted simply by continuously amending the particle energy during the implantation process with a differentiable rate (particle energy per time).

However, implanting the particles may also be used to produce an arrangement with a substantially stepped dopant concentration c(v), for instance, an arrangement as explained with reference to FIG. 3B which may be used as starting point in the method described with reference to FIGS. 3B to 3H.

As in case of a conventional coreless transformer an electrical breakdown occurs predominantly on that parts 410 of the outermost windings 411 and 421 of the transformer coils 41 and 42, respectively, that face away from both the bottom side 12 and the coil axis 91, 92 of the respective coil 41, 42 (see also FIGS. 1 and 2). Hence, in any embodiment of the present invention, at least the outermost windings 411, 421 may be rounded at least on the top side parts 410 of that sides of the outermost windings 411, 421 of the transformer coil 41 and 42, respectively that face away from both the bottom side 12 and the coil axis 91, 92 of the respective coil 41, 42. At that top side part 410, the outermost winding 411, 421 may have a radius of curvature R in the ranges described above.

Figure 9:
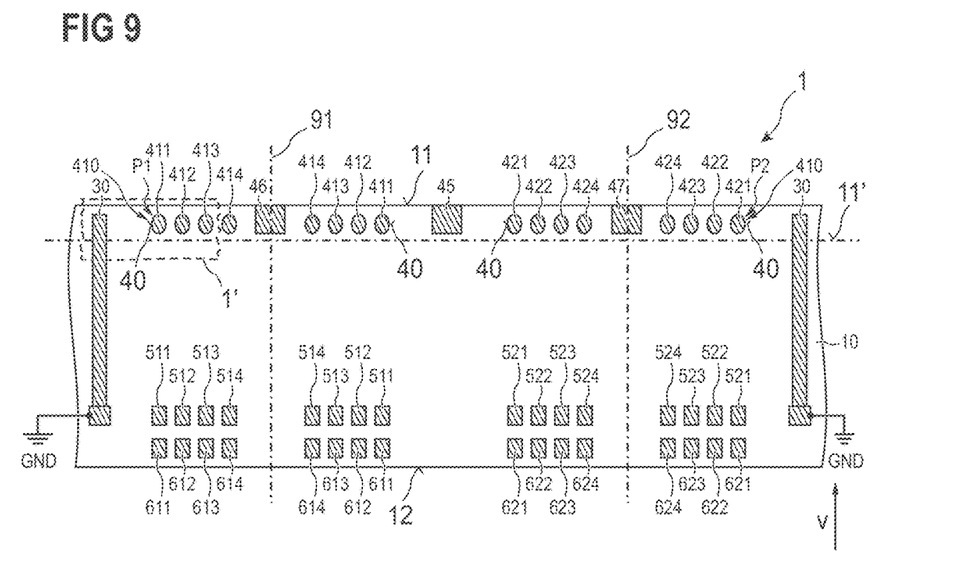
FIG. 9 is a cross-sectional view of coreless transformer coils that differ from the coreless transformer coils of FIG. 2 in that all spiral-shaped windings of the top coils are at least partly rounded.

Instead of only rounding the outermost windings 411, 421 of a coreless transformer coil 41 and 42, respectively, two, more or all windings of that coil 41 and 42, respectively, may be rounded partly or, as illustrated in FIG. 9, completely. The arrangement of FIG. 9 is identical to the arrangement of FIG. 2 with the sole difference that all windings 411, 412, 413, 414 of coil 41 and all windings 421, 422, 423, 424 of coil 42 have, in a cross-sectional plane parallel to the vertical direction v and parallel to the respective coil axes 91 and 92, respectively, rounded surfaces as the winding 411 described in the above examples.

Figure 10:
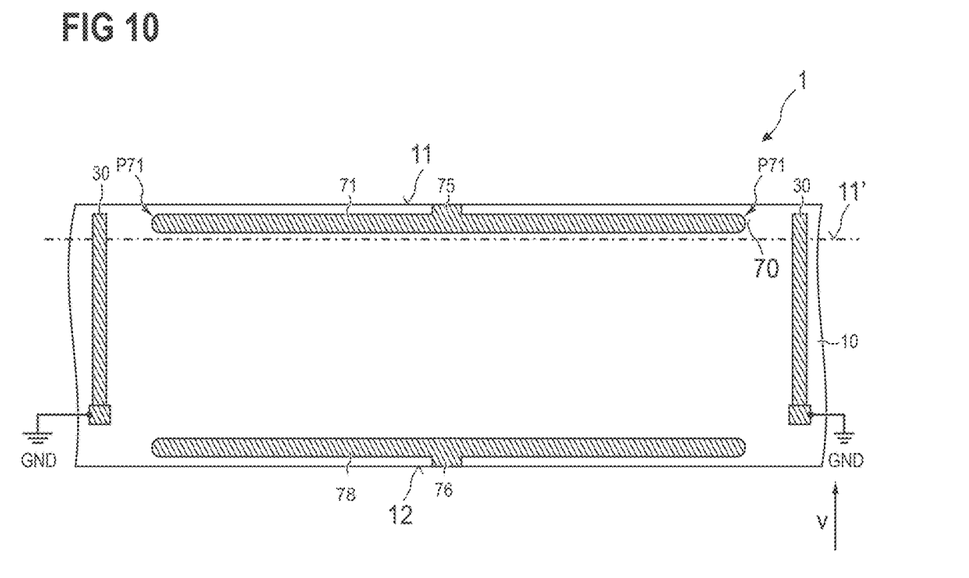
FIG. 10 is a cross-sectional view of a capacitor that is realized in a semiconductor body and that has a rounded electrode.

A further embodiment for a rounded conductor line 71 is illustrated in FIG. 10. In this embodiment, the conductor line 71 is part of a capacitor that is formed from sheet-like parallel conductor lines ("conductor plates") 71 and 78 that extend substantially perpendicular to the drawing plane. The upper conductor line 71 has a contact terminal 75, the bottom conductor line 78 a contact terminal 76. In order to produce a surface 70 of the upper conductor line 71 with points P71 that have a radius of curvature R in the range mentioned above, one of the same methods described with reference to the examples for the production of an at least partly rounded conductor line 411 may be used. As is also illustrated in FIG. 10, the bottom conductor line 78 may be rounded in the same or similar manner as the upper conductor line 71. However, the bottom conductor line 78 may also have an angular cross-section. As well as a coreless transformer, the capacitor 71, 78 may be used to galvanically decouple a circuit for driving a controllable semiconductor element from a control electrode of that semiconductor element. Such a semiconductor element may be realized in the same semiconductor body as the capacitor 71, 78 or the coreless transformer, or in a different semiconductor body.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc., and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a" "an" and "the" are intended to include the plural as well as the singular, unless the context clearly indicates otherwise.

Although present embodiments and its advantages have been described in detail, it should be understood that various changes, substitutions and alterations can be made herein without departing from the spirit and the scope of the invention as defined by the appended claims. With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a conductor line of a semiconductor component, the method comprising:
   providing a partially completed semiconductor component with a bottom side and a top side spaced distant from the bottom side in a vertical direction;
   providing an etchant;
   arranging a dielectric layer that is doped with a dopant on the top side by subsequently depositing a number of sub-layers, wherein a dopant concentration of the dopant has a maximum in a first one of the sub-layers, and wherein the dopant concentration of the dopant is zero in a second one of the sub-layers and greater than zero in a third one of the sub-layers, wherein the first one of the sub-layers is located between the second one of the sub-layers and the third one of the sub-layers;
   forming a trench in each of the sub-layers of the dielectric layer using an anisotropic plasma etch process;

widening the trench by etching the trench with the etchant at different etch rates caused by different concentrations of the dopant; and forming a conductor line by filling the widened trench with an electrically conductive material.

2. The method as claimed in claim 1, wherein each of the sub-layers comprises, in the vertical direction, a thickness of at least 100 nm.

3. The method as claimed in claim 1, wherein each of the sub-layers comprises, in the vertical direction, a thickness of at least 400 nm.

4. The method as claimed in claim 1, wherein the number of sub-layers is at least 5.

5. The method as claimed in claim 1, wherein the dopant comprises, within the dielectric layer and along a line parallel to the vertical direction, a maximum dopant concentration; and a place of the maximum dopant concentration is spaced distant from the top side.

6. The method as claimed in claim 1, wherein the dopant is one of phosphorus (P), boron (B), silver (Ag), arsenic (As), and argon (Ar).

7. The method as claimed in claim 1, further comprising:
arranging a mask layer on the top side, the mask layer comprising an opening; and
forming the trench by etching the dielectric layer underneath the opening, thereby using the mask layer as an etching mask.

8. The method as claimed in claim 7, wherein filling the widened trench comprises introducing the electrically conductive material through the opening into the widened trench.

9. The method as claimed in claim 7, further comprising removing partially or completely the mask layer and a part of the electrically conductive material arranged in the opening.

10. The method as claimed in claim 7, wherein, in a cross-sectional plane perpendicular to a running direction of the widened trench,
the opening comprises a minimum width; and
the widened trench comprises, in a region between the opening and the bottom side, a maximum width, wherein the maximum width is greater than the minimum width.

11. The method as claimed in claim 10, wherein, in the cross-sectional plane perpendicular to the running direction of the widened trench, the maximum width is greater than a difference between
a distance between the bottom side and the opening; and
a distance between the bottom side and the conductor line.

12. The method as claimed in claim 7, wherein no additional material is deposited on a surface of the widened trench, prior to filling the widened trench with the electrically conductive material.

13. The method as claimed in claim 1, wherein the dielectric layer comprises a silicon oxide (SiOx).

14. The method as claimed in claim 1, wherein the conductor line comprises, in a cross-sectional plane perpendicular to a running direction of the widened trench, a surface with a surface location at which a radius of curvature of the location is in a range from 0.4 µm to 3.2 µm.

15. The method as claimed in claim 1, wherein the conductor line comprises, in a cross-sectional plane perpendicular to a running direction of the widened trench, a continuous surface path that extends, in the vertical direction, over a distance of at least 100 nm or of at least 0.8 µm and that has everywhere a radius of curvature in a range from 0.4 µm 3.2 µm.

16. The method as claimed in claim 1, wherein the electrically conductive material
(a) consists of copper or aluminum; or
(b) comprises copper or aluminum; or
(c) consists of copper and aluminum; or
(d) comprises copper and aluminum; or
(e) comprises or consists of polycrystalline semiconductor material.

17. The method as claimed in claim 1, wherein the conductor line is an outer winding of a coil of a coreless transformer of the semiconductor component.

18. The method as claimed in claim 17, wherein the coreless transformer galvanically decouples a control circuit configured to control a semiconductor element from a control electrode of the semiconductor element.

19. The method as claimed in claim 1, wherein the conductor line is an electrode of a capacitor.

20. The method as claimed in claim 19, wherein the capacitor galvanically decouples a control circuit configured to control a semiconductor element from a control electrode of the semiconductor element.

* * * * *